US011342490B2

(12) United States Patent
Tosho

(10) Patent No.: US 11,342,490 B2
(45) Date of Patent: May 24, 2022

(54) THERMOELECTRIC LEG AND THERMOELECTRIC ELEMENT COMPRISING SAME

(71) Applicant: LG INNOTEK CO., LTD., Seoul (KR)

(72) Inventor: Tsuyoshi Tosho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/998,412

(22) Filed: Aug. 20, 2020

(65) Prior Publication Data
US 2020/0381605 A1 Dec. 3, 2020

Related U.S. Application Data

(63) Continuation of application No. 16/099,292, filed as application No. PCT/KR2017/005754 on Jun. 1, 2017, now Pat. No. 11,233,187.

(30) Foreign Application Priority Data

Jun. 1, 2016 (KR) .................. 10-2016-0068345
Jun. 1, 2017 (KR) .................. 10-2017-0068656

(51) Int. Cl.
*H01L 35/16* (2006.01)
*H01L 35/32* (2006.01)
(Continued)

(52) U.S. Cl.
CPC ............. *H01L 35/16* (2013.01); *H01L 35/02* (2013.01); *H01L 35/10* (2013.01); *H01L 35/12* (2013.01);
(Continued)

(58) Field of Classification Search
CPC .................. H01L 35/16; H01L 35/18
See application file for complete search history.

(56) References Cited

U.S. PATENT DOCUMENTS 5,959,341 A 9/1999 Tsuno et al.
6,083,770 A 7/2000 Sato
(Continued)

FOREIGN PATENT DOCUMENTS

JP H 10-041553 2/1998
JP H 10-321919 12/1998
(Continued)

OTHER PUBLICATIONS

Wen P Lin et al: "Barrier/bonding layers on bismuth telluride (BiTe) for high temperature thermoelectric modules", Journal of Materials Science: Materials in Electronics, Kluwer Academic Publishers, Bo, vol. 22, No. 9, Jan. 26, 2011 (Jan. 26, 2011), pp. 1313-1320, XP019937018.

(Continued)

*Primary Examiner* — Eric R Smith
(74) *Attorney, Agent, or Firm* — KED & Associates LLP

(57) ABSTRACT

A method may be provided of manufacturing a thermoelectric leg. The method may include preparing a first metal substrate including a first metal, and forming a first plated layer including a second metal on the first metal substrate. The method may also include disposing a layer including tellurium (Te) on the first plated layer, and forming a portion of the first plated layer as a first bonding layer by reacting the second metal and the Te. The method also includes disposing a thermoelectric material layer including bismuth (Bi) and Te on an upper surface of the first bonding layer, and disposing a second metal substrate, on which a second bonding layer and a second plated layer are formed, on the thermoelectric material layer, and sintering.

19 Claims, 13 Drawing Sheets

(51) Int. Cl.
- *H01L 35/34* (2006.01)
- *H01L 35/18* (2006.01)
- *H01L 35/26* (2006.01)
- *H01L 35/12* (2006.01)
- *H01L 35/02* (2006.01)
- *H01L 35/10* (2006.01)

(52) U.S. Cl.
CPC .............. *H01L 35/18* (2013.01); *H01L 35/26* (2013.01); *H01L 35/32* (2013.01); *H01L 35/34* (2013.01)

(56) References Cited

U.S. PATENT DOCUMENTS

| | | |
|---|---|---|
| 2006/0151021 A1 | 7/2006 | Stark |
| 2010/0218796 A1 | 9/2010 | Hiroyama |
| 2012/0060887 A1* | 3/2012 | Kim .................. H01L 35/34 136/224 |
| 2013/0213447 A1 | 8/2013 | Hayashi |
| 2014/0096809 A1 | 4/2014 | Kim |
| 2016/0133815 A1 | 5/2016 | Akabane |
| 2018/0076372 A1 | 3/2018 | Ren |

FOREIGN PATENT DOCUMENTS

| | | |
|---|---|---|
| JP | H 11-121813 | 4/1999 |
| JP | 2009-099686 | 5/2009 |
| JP | 2010-182940 | 8/2010 |
| JP | 2014-086623 | 5/2014 |

OTHER PUBLICATIONS

International Search Report (with English Translation) and Written Opinion dated Sep. 8, 2017 issued in Application No. PCT/KR2017/005754.
European Search Report dated Nov. 20, 2019 issued in Application No. 17807042.1.
U.S. Office Action dated May 6, 2020 issued in parent U.S. Appl. No. 16/099,292.
U.S. Office Action dated Aug. 19, 2020 issued in parent U.S. Appl. No. 16/099,292.
U.S. Notice of Allowance issued in U.S. Appl. No. 16/099,292 dated Sep. 30, 2021.

* cited by examiner (a)

(b)

(c)

(d)

(a)

(b)

(c)

(d)

THERMOELECTRIC LEG AND THERMOELECTRIC ELEMENT COMPRISING SAME

CROSS-REFERENCE TO RELATED APPLICATIONS

This application is a Continuation Application of U.S. patent application Ser. No. 16/099,292 filed Nov. 6, 2018, which is a U.S. National Stage Application under 35 U.S.C. § 371 of PCT Application No. PCT/KR2017/005754, filed Jun. 1, 2017, which claims priority under 35 U.S.C. § 119 to Korean Application No. 10-2016-0068345, filed Jun. 1, 2016, and Korean Patent Application No. 10-2017-0068656, filed Jun. 1, 2017, whose entire disclosures are hereby incorporated by reference.

BACKGROUND

1. Field

The present invention relates to a thermoelectric element, and more specifically, to a thermoelectric leg included in a thermoelectric element.

2. Background

A thermoelectric effect is a phenomenon occurring due to movement of electrons and holes in a material, and means direct energy conversion between heat and electricity.

A thermoelectric element is a generic term of elements in which a thermoelectric effect is used, and has a structure in which P-type thermoelectric legs and N-type thermoelectric legs are bonded between metal electrodes to form PN junction pairs.

The thermoelectric elements may be divided into elements which use a change in electrical resistance according to a change in temperature, elements which use the Seebeck effect in which an electromotive force is generated due to a difference in temperature, and elements which use the Peltier effect in which heating or heat absorption occurs due to a current.

The thermoelectric elements have been variously applied to home appliances, electronic components, communication components, and the like. For example, the thermoelectric elements may be applied to cooling apparatuses, heating apparatuses, power generation apparatuses, and the like. Therefore, the demand for thermoelectric performance of the thermoelectric elements is gradually increasing.

Meanwhile, in order to stably bond the thermoelectric legs to the electrodes, metal layers may be formed between the thermoelectric legs and the electrodes. Here, in order to prevent a phenomenon in which thermoelectric performance is degraded due to reactions between semiconductor materials in the thermoelectric legs and the metal layers and to prevent oxidation of the metal layers, plated layers may be formed between the thermoelectric legs and the metal layers.

However, in a process in which the plated layers and the thermoelectric legs are simultaneously sintered, a part of the semiconductor material in the thermoelectric leg can be diffused into the plated layer, and accordingly, the semiconductor material can be nonuniformly distributed around a boundary between the plated layer and the thermoelectric leg. For example, in a case in which the thermoelectric leg includes Bi and Te, when Te is diffused into the plated layer, a Bi-rich layer in which a Bi content is relatively large may be formed. In the Bi-rich layer, a proper stoichiometry ratio between Bi and Te is broken so that resistance increases, and therefore, the performance of the thermoelectric element can decrease.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
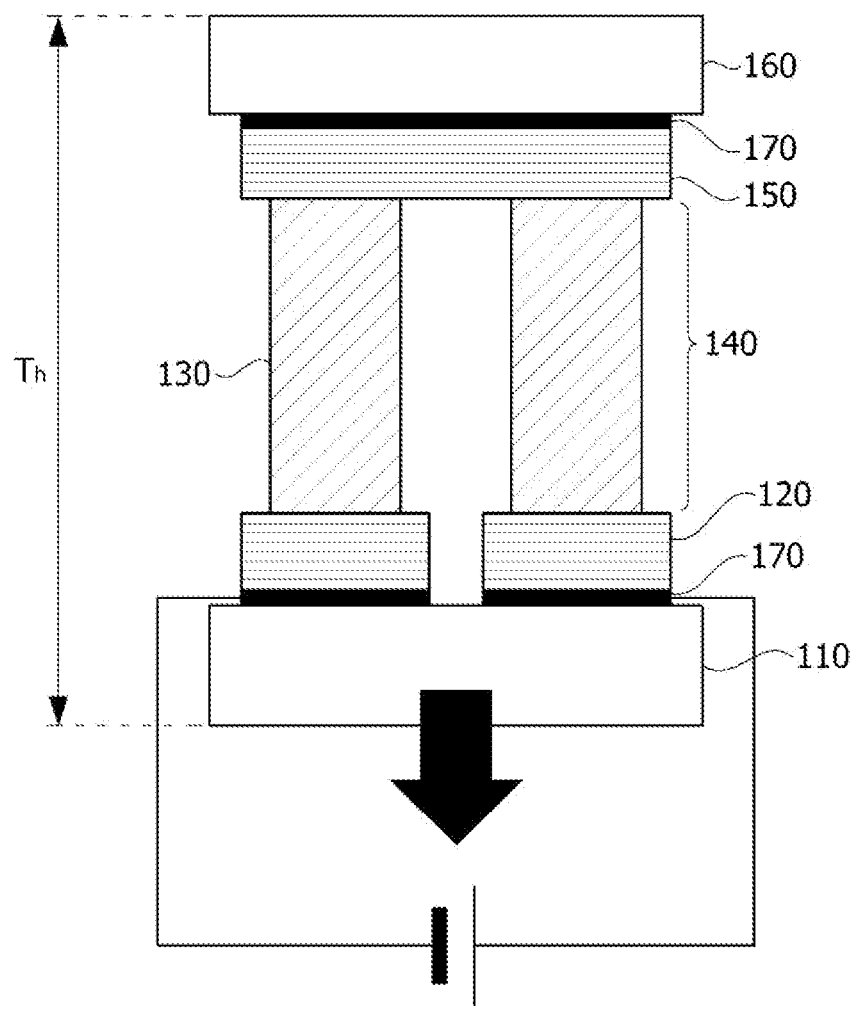
FIG. 1 is a cross-sectional view illustrating a thermoelectric element.

As the invention allows for various changes and numerous embodiments, specific embodiments will be illustrated in the drawings and described in detail in the written description. However, this is not intended to limit the present invention to specific modes of practice, and it is to be appreciated that all changes, equivalents, and substitutes that do not depart from the spirit and technical scope of the present invention are encompassed in the present invention.

It will be understood that, although the terms "first," "second," etc. may be used herein to describe various elements, these elements should not be limited to the terms. The terms are only used to distinguish one element from another. For example, a first element could be termed a second element, and a second element could similarly be termed a first element without departing from the scope of the present invention. As used herein, the term "and/or" includes any one or combinations of the associated listed items.

It will be understood that when an element is referred to as being "connected" or "coupled" to another element, it may be directly connected or coupled to another element or intervening elements may be present. In contrast, when an element is referred to as being "directly connected" or "directly coupled" to another element, there are no intervening elements.

The terminology used herein is for the purpose of describing specific embodiments only and is not intended to be limiting to the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Example embodiments of the invention will be described below in more detail with reference to the accompanying drawings. Components that are the same or are corresponding to each other are rendered the same reference numeral regardless of the figure number, and redundant description will be omitted.

Figure 2:
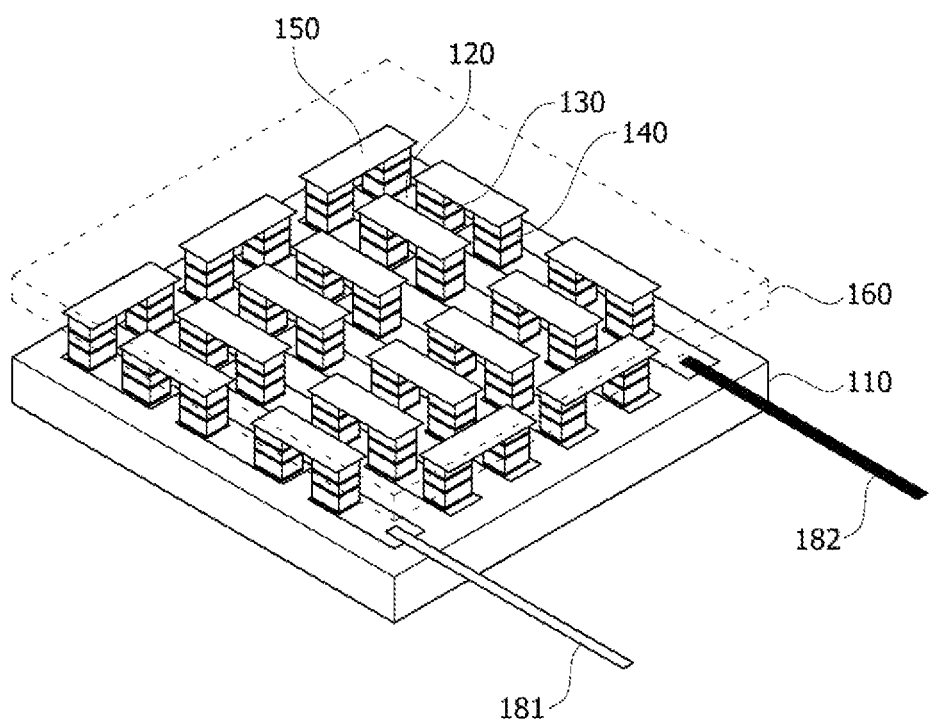
FIG. 2 is a perspective view illustrating the thermoelectric element.

FIG. 1 is a cross-sectional view illustrating a thermoelectric element, and FIG. 2 is a perspective view illustrating the thermoelectric element.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are interposed between the lower substrate 110 and lower surfaces of the P-type thermoelectric legs 130 and the N-type thermoelectric legs 140, and the upper electrodes 150 are interposed between the upper substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 are electrically connected through the lower electrodes 120 and the upper electrodes 150. A pair of the P-type thermoelectric leg 130 and the N-type thermoelectric leg 140 interposed between the lower electrodes 120 and the upper electrode 150 and electrically connected to each other may form a unit cell.

For example, when a voltage is applied to the lower electrodes 120 and the upper electrodes 150 through lead wires 181 and 182, the substrate, in which a current flowing from the P-type thermoelectric leg 130 to the N-type thermoelectric leg 140 flows, may absorb heat to serve as a cooling portion, and the substrate, in which a current flowing from the N-type thermoelectric leg 140 to the P-type thermoelectric leg 130 flows, may be heated to serve as a heating portion, due to the Peltier effect.

Here, the P-type thermoelectric leg 130 and the N-type thermoelectric leg 140 may be bismuth-telluride (Bi—Te)-based thermoelectric legs mainly including bismuth (Bi) and tellurium (Te). The P-type thermoelectric leg 130 may be a thermoelectric leg including, in the range of 99 to 99.999 wt %, a Bi—Te-based main material containing at least one among antimony (Sb), nickel (Ni), aluminum (Al), copper (Cu), silver (Ag), lead (Pb), boron (B), gallium (Ga), tellurium (Te), bismuth (Bi), and indium (In) and, in the range of 0.001 to 1 wt %, a mixture containing Bi or Te based on a total weight of 100 wt %. For example, the P-type thermoelectric leg 130 may mainly include Bi-selenium (Se)—Te and may further include Bi or Te in the range of 0.001 to 1 wt % based on a total weight. The N-type thermoelectric leg 140 may be a thermoelectric leg including, in the range of 99 to 99.999 wt %, a Bi—Te-based main material containing at least one among Se, Ni, Cu, Ag, Pb, B, Ga, Te, Bi, and In and, in the range of 0.001 to 1 wt %, a mixture containing Bi or Te based on a total weight of 100 wt %. For example, the N-type thermoelectric leg 140 may mainly include Bi—Sb—Te and may further include Bi or Te in the range of 0.001 to 1 wt % based on a total weight.

The P-type thermoelectric leg 130 and the N-type thermoelectric leg 140 may be formed in a bulk type or stack type. Generally, the bulk type P-type thermoelectric leg 130 or bulk type N-type thermoelectric leg 140 may be formed through a process of heat-treating a thermoelectric material to manufacture an ingot, the ingot is grinded and strained to obtain a powder for a thermoelectric leg, the powder is sintered, and a sintered body is cut. The stack type P-type thermoelectric leg 130 or stack type N-type thermoelectric leg 140 may be formed in processes of coating sheet-shaped bases with a paste including a thermoelectric material to form unit members and stacking and cutting the unit members.

Here, the pair of the P-type thermoelectric leg 130 and the N-type thermoelectric leg 140 may have the same shape and volume, or may have different shapes and volumes. For example, since electrical conduction properties of the P-type thermoelectric leg 130 and the N-type thermoelectric leg 140 are different, a height or cross sectional area of the N-type thermoelectric leg 140 may be different from that of the P-type thermoelectric leg 130.

The performance of the thermoelectric element according to one embodiment of the present invention may be expressed as a Seebeck index. The Seebeck index (ZT) may be expressed by Equation 1.

$$ZT = \alpha^2 \cdot \sigma \cdot T/k$$

Here, $\alpha$ is the Seebeck coefficient [V/K], $\sigma$ is electric conductivity [S/m], $\alpha^2 \cdot \sigma$ is a power factor [W/mK$^2$]. In addition, T is temperature, k is thermal conductivity [W/mK]. k may be expressed as $a \cdot cp \cdot \rho$, and a is thermal diffusivity [cm$^2$/S], cp is specific heat [J/gK], and $\rho$ is density [g/cm$^3$].

In order to obtain a Seebeck index of a thermoelectric element, a Z value [V/K] is measured using a Z meter, and thus the Seebeck index (ZT) may be calculated using the measured Z value.

Here, the lower electrodes 120 interposed between the lower substrate 110 and the P-type and N-type thermoelectric legs 130 and 140, and the upper electrode 150 interposed between the upper substrate 160 and the P-type and N-type thermoelectric legs 130 and 140 may include at least one among Cu, Ag, Al, and Ni, and may have thicknesses of 0.01 mm to 0.3 mm. In a case in which the thickness of the lower electrode 120 or upper electrode 150 is less than 0.01 mm, an electrode function thereof is degraded so that electric conductivity performance thereof may be lowered, and in a case in which the thickness thereof is greater than 0.3 mm, resistance thereof increases so that conduction efficiency thereof may be lowered.

In addition, the lower substrate 110 and the upper substrate 160, which are opposite, may be insulating substrates or metal substrates. The insulating substrate may be an alumina substrate or flexible polymer resin substrate. The flexible polymer resin substrate may include various insulating resin materials such as high permeability plastics including polyimide (PI), polystyrene (PS), poly methyl methacrylate (PMMA), a cyclic olefin copolymer (COC), polyethylene terephthalate (PET), and a resin. The metal substrate may include Cu, a Cu alloy, or a Cu—Al alloy, and a thickness thereof may be in the range of 0.1 mm to 0.5 mm. In a case in which the thickness of the metal substrate is less than 0.1 mm or greater than 0.5 mm, since a heat dissipation property or thermal conductivity thereof may become excessively high, the reliability of the thermoelectric element may be degraded. In addition, in a case in which the lower substrate 110 and the upper substrate 160 are the metal substrates, dielectric layers 170 may be further formed between the lower substrate 110 and the lower electrodes 120 and between the upper substrate 160 and the upper electrode 150. The dielectric layer 170 may include a material having a thermal conductivity of 5 to 10 W/K, and may have a thickness of 0.01 mm to 0.15 mm. In a case in which the thickness of the dielectric layer 170 is less than 0.01 mm, insulating efficiency or a withstanding voltage property may be degraded, and in a case in which the thickness thereof is greater than 0.15 mm, thermal conductivity is lowered so that heat dissipation efficiency may drop.

Here, sizes of the lower substrate 110 and the upper substrate 160 may also be different. For example, a volume, thickness, or area of one of the lower substrate 110 and the upper substrate 160 may be greater than that of the other thereof. Accordingly, the heat absorption or dissipation performance of the thermoelectric element can be enhanced.

In addition, a heat dissipation pattern, for example, an irregular pattern may also be formed on at least one surface of the lower substrate 110 and the upper substrate 160. Accordingly, the heat dissipation performance of the thermoelectric element can be enhanced. In a case in which the irregular pattern is formed on a surface in contact with the P-type thermoelectric leg 130 or N-type thermoelectric leg 140, a bonding property between the thermoelectric leg and the substrate can also be improved.

Meanwhile, the P-type thermoelectric leg 130 or N-type thermoelectric leg 140 may have a cylindrical shape, a polygonal column shape, an elliptical column shape, or the like.

According to one embodiment of the present invention, a width of a portion, which is bonded to the electrode, of the P-type thermoelectric leg 130 or N-type thermoelectric leg 140 may be large.

Figure 3:
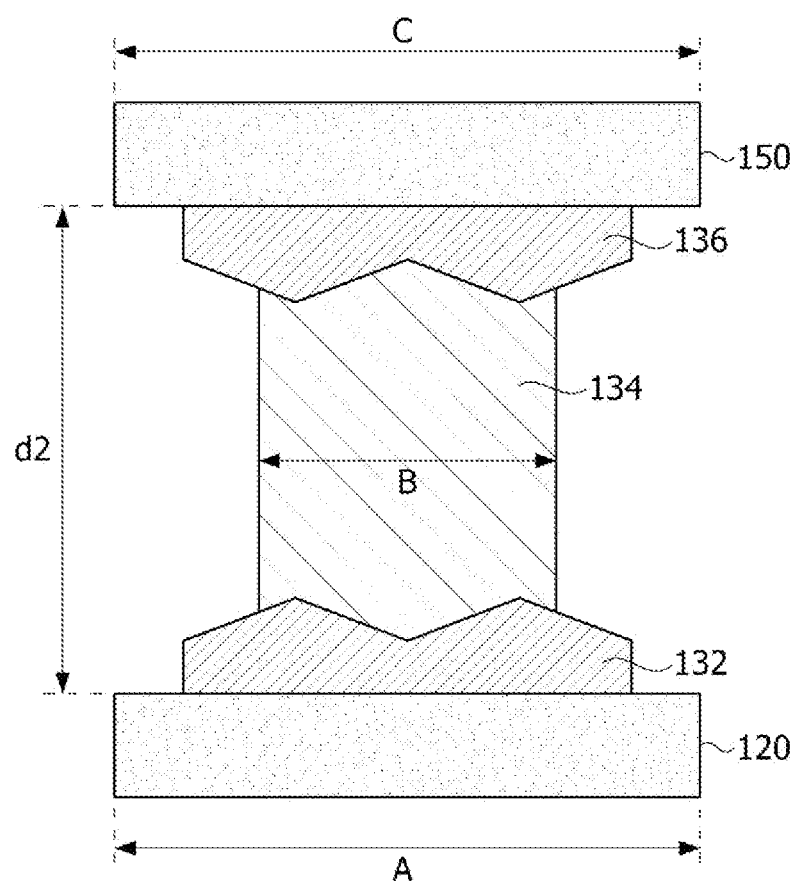
FIG. 3 is a cross-sectional view illustrating a thermoelectric leg and electrodes according to one embodiment of the present invention.

FIG. 3 is a cross-sectional view illustrating a thermoelectric leg and electrodes according to one embodiment of the present invention.

Referring to FIG. 3, the thermoelectric leg 130 may include a first element part 132 having a first cross sectional area, a second element part 136 disposed at a position opposite the first element part 132 and having a second cross sectional area, and a connecting part 134 connecting the first element part 132 and the second element part 136 and having a third cross sectional area. Here, the cross sectional area of an arbitrary lateral region of the connecting part 134 may be less than the first cross sectional area or second cross sectional area.

As described above, when the cross sectional area of each of the first element part 132 and the second element part 136 is greater than the cross sectional area of the connecting part 134, a temperature difference T between the first element part 132 and the second element part 136 may be high by using the same amount of material. Accordingly, since an amount of free electrons moving between a hot side and a cold side is large, an amount of power generation increases, and heating or cooling efficiency can increase.

Here, a ratio between a width B of a cross section having a longest width among lateral cross sections of the connecting part 134 and a greatest lateral width A or C of the first element part 132 or second element part 136 may be in the range of 1:1.5 to 4. Accordingly, electricity efficiency, heating efficiency, or cooling efficiency can increase.

Here, the first element part 132, the second element part 136, and the connecting part 134 may be integrally formed using the same material.

The thermoelectric leg according to one embodiment of the present invention may also have a stack structure. For example, the P-type thermoelectric leg or N-type thermoelectric leg may be formed through a method of stacking a plurality of structures coated with a semiconductor material on a sheet-shaped base and cutting the plurality of structures. Accordingly, material loss can be prevented and an electrical conduction property can be improved FIG. 4 is a view illustrating a method of manufacturing a thermoelectric leg having a stack structure.

Figure 4:
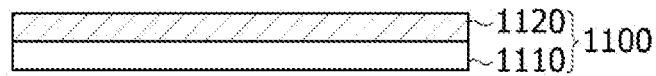
FIG. 4 is a view illustrating a method of manufacturing a thermoelectric leg having a stack structure.
Figure 4:
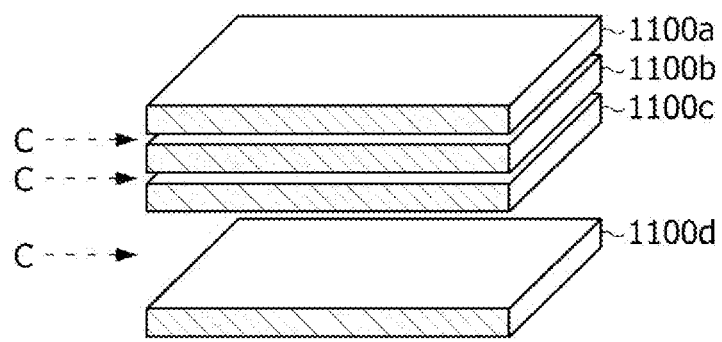
Figure 4:
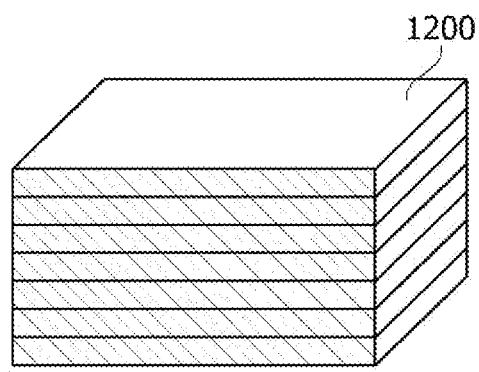
Figure 4:
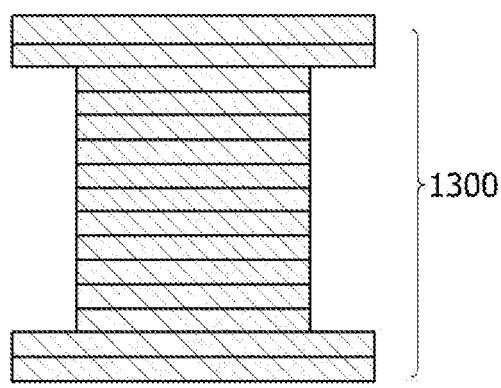

Referring to FIG. 4, after a material including a semiconductor material is formed in a paste type, a base 1110, such as a sheet or a film, is coated with the material to form a semiconductor layer 1120. Accordingly, one unit member 1100 may be formed.

A plurality of unit members 1100a, 1100b, and 1100c are stacked to form a stack structure 1200, and the stack structure 1200 is cut to obtain a unit thermoelectric leg 1300.

As described above, the plurality of unit members 1100 in which semiconductor layers 1120 are formed on members 1110 may be stacked to form the unit thermoelectric leg 1300.

Here, a process of coating the base 1110 with the paste may be performed through various methods. For example, the process may be performed through a tape casting method. The tape casting method is a method of mixing a fine semiconductor material powder with at least one selected from among a water-based or non-water-based solvent, a binder, a plasticizer, a dispersant, a defoamer, and a surfactant to produce a slurry type material, and the material is molded on a moving blade or base. Here, the base 1110 may be a film or sheet having a thickness of 10 μm to 100 μm, and the semiconductor material may be identical to the P-type thermoelectric material or N-type thermoelectric material for manufacturing the above-described bulk type element.

A process of aligning and stacking the unit members 1100 to be a plurality of layers may be performed through a method of compressing the unit members 1100 at a temperature of 50 to 250° C., and, for example, the number of stacked unit members 1100 may be in the range of 2 to 50. Then, the stacked unit members 1100 may be cut with a desired shape and a size, and a sintering process may be further performed.

Uniformity in thickness, shape, and size of the unit thermoelectric leg 1300 manufactured as described above may be secured, and it may be advantageous to form the thermoelectric leg 1300 to be thin, and material loss can decrease.

The unit thermoelectric leg 1300 may have a cylindrical shape, a polygonal column shape, an elliptical column shape, or the like, and may be cut to have a shape illustrated in FIG. 4D.

Meanwhile, in order to manufacture the thermoelectric leg having the stack structure, a conductive layer may also be further formed on one surface of the unit member 1100.

Figure 5:
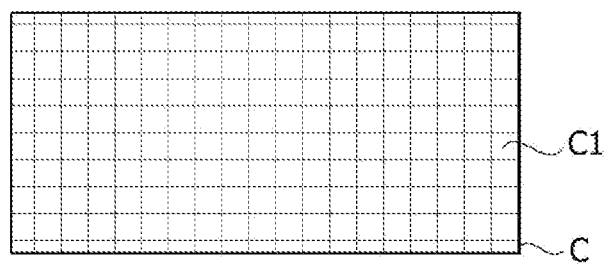
FIG. 5 is a view illustrating an example of a conductive layer formed between unit members in the stack structure of FIG. 4.
Figure 5:
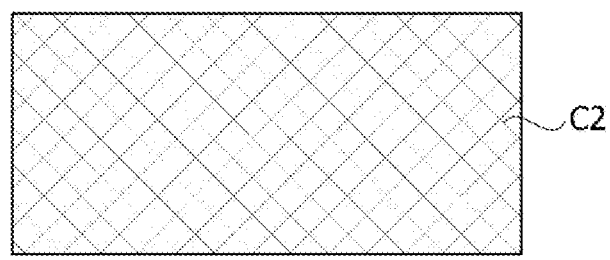
Figure 5:
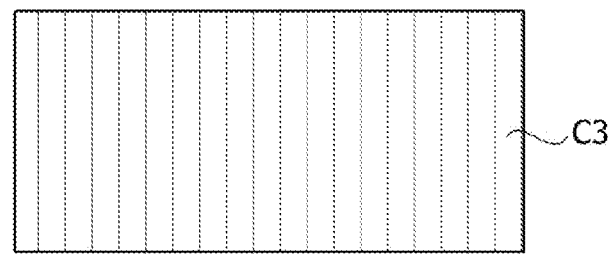
Figure 5:
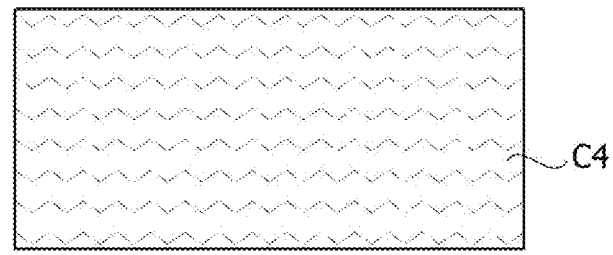

FIG. 5 is a view illustrating an example of the conductive layer formed between unit members in the stack structure of FIG. 4.

Referring to FIG. 5, a conductive layer C may be formed on a surface opposite a surface, on which the semiconductor layer 1120 is formed, of the base 1110, and may be patterned to expose a part of the surface of the base 1110.

FIG. 5 shows various modified examples of the conductive layer C according to the embodiment of the present invention. The conductive layer C may be variously changed to have a mesh type structure including a closed opening pattern C1 or C2 as illustrated in FIGS. 5A and 5B, a line type structure including an open opening pattern C3 or C4 as illustrated in FIGS. 5C and 5D, or the like.

Due to the conductive layer C, a bonding force between the unit members in the unit thermoelectric leg having a structure in which the unit members are stacked may be enhanced, thermal conductivity between the unit members may be lowered, and electric conductivity may be improved. The conductive layer C may include a metal material, for example, Cu, Ag, or Ni.

Figure 6:
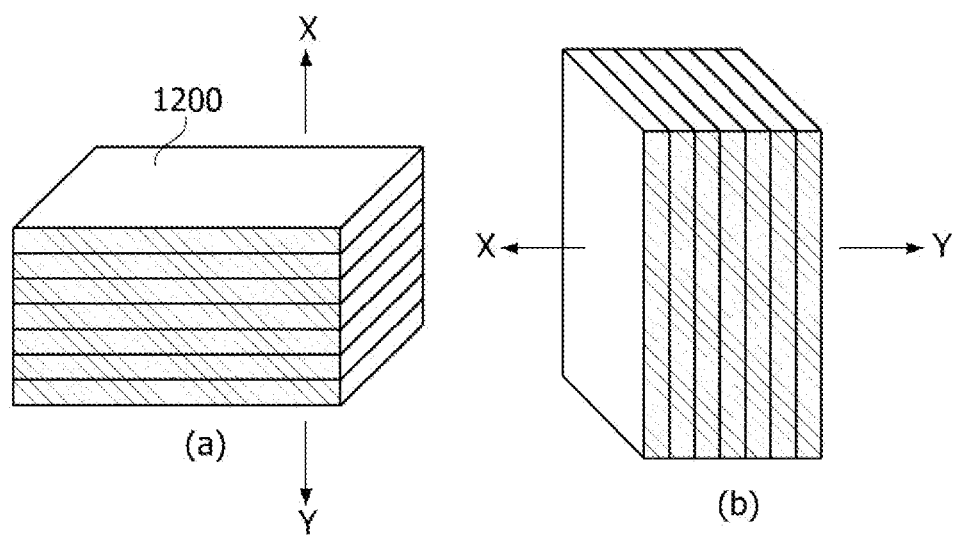
FIG. 6 is a view illustrating a unit thermoelectric leg having the stack structure.
Figure 6:
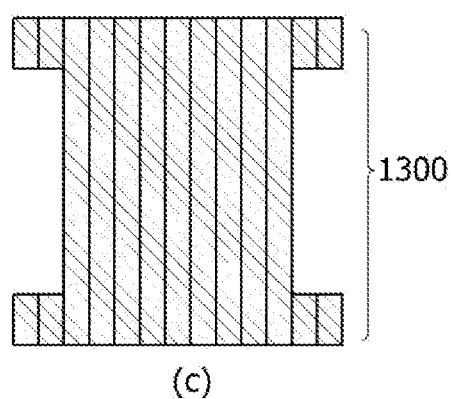

Meanwhile, the unit thermoelectric leg 1300 may be cut in a direction illustrated in FIG. 6. According to the above-described structure, vertical thermal conduction efficiency may be lowered, and a vertical electrical conduction property may be improved at the same time so that cooling efficiency can increase.

According to one embodiment of the present invention, metal layers are formed on both surfaces of thermoelectric legs for stable bonding between the thermoelectric legs and electrodes.

Figure 7:
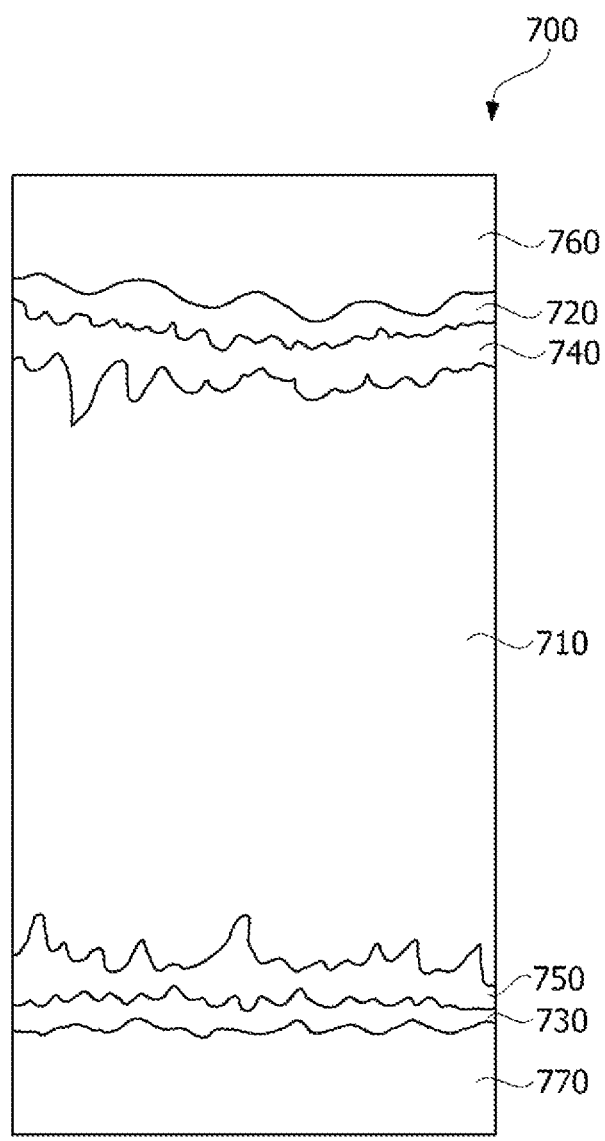
FIG. 7 is a cross-sectional view illustrating a thermoelectric leg according to one embodiment of the present invention.
Figure 8:
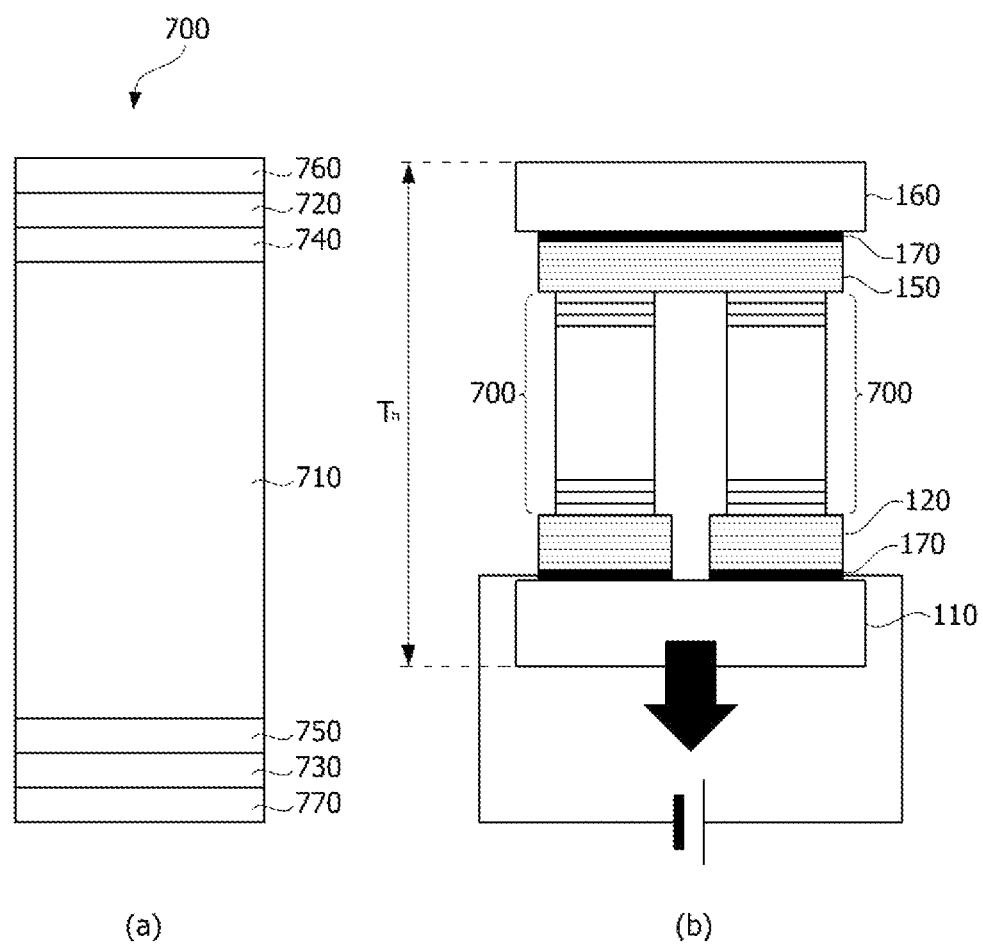
FIG. 8A is a schematic view illustrating the thermoelectric leg of FIG. 7.
FIG. 8B is a cross-sectional view illustrating the thermoelectric element including the thermoelectric leg of FIG. 8A.

FIG. 7 is a cross-sectional view illustrating a thermoelectric leg according to one embodiment of the present invention, FIG. 8A is a schematic view illustrating the thermoelectric leg of FIG. 7, and FIG. 8B is a cross-sectional view illustrating the thermoelectric element including the thermoelectric leg of FIG. 8A.

Referring to FIGS. 7, 8A, and 8B, a thermoelectric leg 700 according to one embodiment of the present invention includes a thermoelectric material layer 710, a first plated layer 720 disposed above one surface of the thermoelectric material layer 710, a second plated layer 730 disposed above the other surface thereof, which is opposite the one surface, of the thermoelectric material layer 710, a first bonding layer 740 and a second bonding layer 750 respectively interposed between the thermoelectric material layer 710 and the first plated layer 720 and between the thermoelectric material layer 710 and the second plated layer 730, and a first metal layer 760 and a second metal layer 770 respectively disposed on the first plated layer 720 and the second plated layer 730.

That is, the thermoelectric leg 700 according to one embodiment of the present invention includes the thermoelectric material layer 710, the first metal layer 760 and the second metal layer 770 respectively disposed above the one surface and the other surface of the thermoelectric material layer 710, the first bonding layer 740 interposed between the thermoelectric material layer 710 and the first metal layer 760, the second bonding layer 750 interposed between the thermoelectric material layer 710 and the second metal layer 770, the first plated layer 720 interposed between the first metal layer 760 and the first bonding layer 740, and the second plated layer 730 interposed between the second metal layer 770 and the second bonding layer 750. Here, the thermoelectric material layer 710 may be in direct contact with the first bonding layer 740, and the thermoelectric material layer 710 may be in direct contact with the second bonding layer 750. In addition, the first bonding layer 740 may be in direct contact with the first plated layer 720, and the second bonding layer 750 may be in direct contact with the second plated layer 730. In addition, the first plated layer 720 may be in direct contact with the first metal layer 760, and the second plated layer 730 may be in direct contact with the second metal layer 770.

Here, the thermoelectric material layer 710 may include Bi and Te which are semiconductor materials. The thermoelectric material layer 710 may have the same material and shape as those of the P-type thermoelectric leg 130 or N-type thermoelectric leg 140 described in FIGS. 1 to 6.

In addition, the first metal layer 760 and the second metal layer 770 may include Cu, a Cu alloy, Al, or an Al alloy, have thicknesses of 0.1 to 0.5 mm, and preferably have thicknesses of 0.2 to 0.3 mm. Since thermal expansion coefficients of the first metal layer 760 and the second metal layer 770 are similar to or greater than that of the thermoelectric material layer 710, compression stresses are applied to an interface between the first metal layer 760 and the thermoelectric material layer 710 and an interface between the second metal layer 770 and the thermoelectric material layer 710 when sintering, and thus cracking or delamination can be prevented. In addition, since bonding forces between the first metal layer 760 and the electrode 150 and between the second metal layer 770 and the electrode 120 are high, the thermoelectric leg 700 can be stably bonded to the electrodes 120 and 150.

Next, each of the first plated layer 720 and the second plated layer 730 may include at least one among Ni, Sn, Ti, Fe, Sb, Cr, and Mo, and have a thickness of 1 to 20 μm, and preferably have a thickness of 1 to 10 μm. Since the first plated layer 720 and the second plated layer 730 prevent reactions between Bi or Te, which is a semiconductor material, in the thermoelectric material layer 710 and the first metal layer 760 and between Bi or Te and the second metal layer 770, a degradation in the performance of the thermoelectric element can be prevented, and oxidation of the first metal layer 760 and the second metal layer 770 can also be prevented.

Figure 9:
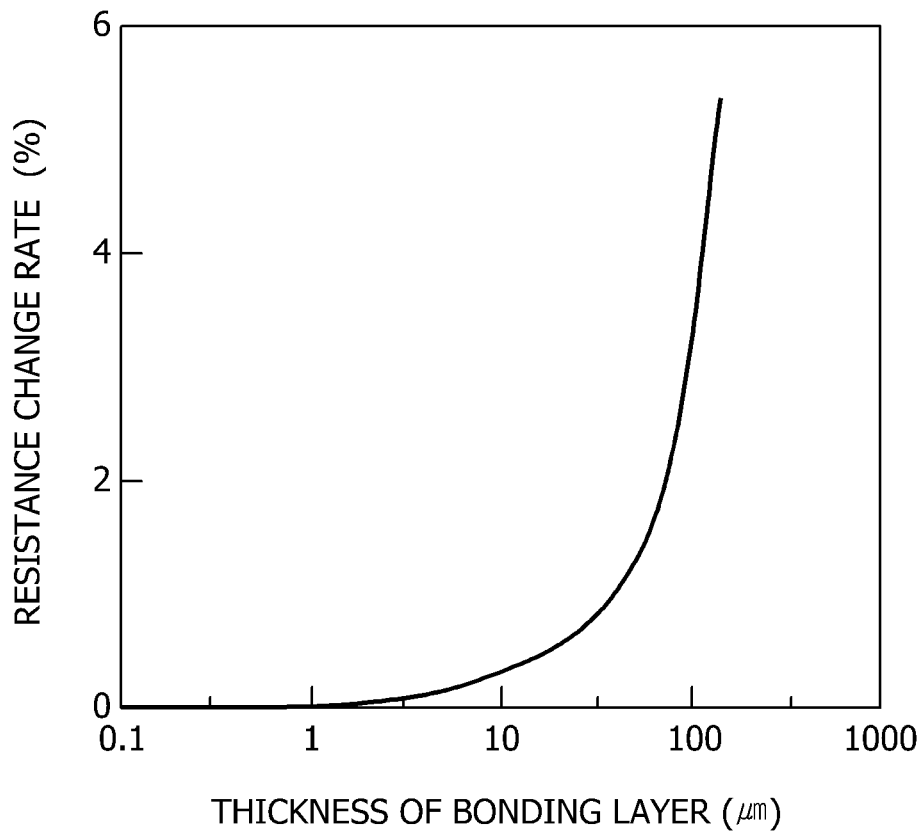
FIG. 9 is a graph showing a resistance change rate according to a thickness of a bonding layer.

Here, the first bonding layer 740 and the second bonding layer 750 may also be interposed between the thermoelectric material layer 710 and the first plated layer 720 and between the thermoelectric material layer 710 and the second plated layer 730. Here, the first bonding layer 740 and the second bonding layer 750 may include Te. For example, each of the first bonding layer 740 and the second bonding layer 750 may include at least one among Ni—Te, Sn—Te, Ti—Te, Fe—Te, Sb—Te, Cr—Te, and Mo—Te. According to the embodiment of the present invention, a thickness of each of the first bonding layer 740 and the second bonding layer 750 may be in the range of 0.5 to 100 μm, and may preferably be in the range of 1 to 50 μm. Referring to FIG. 9 which is a graph showing a resistance change rate according to a thickness of the bonding layer, it can be seen that as the thickness of the bonding layer increases, the resistance change rate increases. Particularly, in a case in which the thickness of the bonding layer is greater than 100 μm, the resistance change rate dramatically increases, and the thermoelectric performance of the thermoelectric element may be negatively affected. Conversely, in a case in which the thickness of the bonding layer is controlled to be 100 μm or less, the resistance change rate may be controlled to be 2% or less.

Generally, Te which is one of semiconductor materials included in the thermoelectric material layer 710 is easily diffused into each of the first plated layer 720 and the second plated layer 730 including at least one among Ni, Sn, Ti, Fe, Sb, Cr, and Mo. When Te in the thermoelectric material layer 710 is diffused into the first plated layer 720 and the second plated layer 730, a region (hereinafter, referred to as a Bi-rich region), in which Bi having a larger amount than that of Te is distributed, may be generated around boundaries between the thermoelectric material layer 710 and the first plated layer 720 and between the thermoelectric material layer 710 and the second plated layer 730. Due to the Bi-rich region, resistance of the thermoelectric leg 700 may increase, and as a result, the performance of the thermoelectric element may be degraded.

However, according to the embodiment of the present invention, the first bonding layer 740 and the second bonding layer 750, which include Te, are respectively interposed between the thermoelectric material layer 710 and the first plated layer 720 and between the thermoelectric material layer 710 and the second plated layer 730 in advance so that Te in the thermoelectric material layer 710 can be prevented from being diffused into the first plated layer 720 and the second plated layer 730. Accordingly, the generation of the Bi-rich region can be prevented.

Accordingly, a Te content is higher than a Bi content from a centerline of the thermoelectric material layer 710 to an interface between the thermoelectric material layer 710 and the first bonding layer 740, and a Te content is higher than a Bi content from the centerline of the thermoelectric material layer 710 to an interface between the thermoelectric material layer 710 and the second bonding layer 750. In addition, a Te content at a predetermined position between the centerline of the thermoelectric material layer 710 and the interface between the thermoelectric material layer 710 and the first bonding layer 740 or a Te content at a predetermined position between the centerline of the thermoelectric material layer 710 and the interface between the thermoelectric material layer 710 and the second bonding layer 750 may be in the range of 0.8 to 1 times the Te content at the centerline of the thermoelectric material layer 710. For example, a Te content at a predetermined position within a thickness of 100 μm from the interface between the thermoelectric material layer 710 and first bonding layer 740 toward the centerline of the thermoelectric material layer 710 may be in the range of 0.8 to 1 times the Te content at the centerline of the thermoelectric material layer 710.

In addition, a Te content in the first bonding layer 740 or second bonding layer 750 may be in the range of 0.8 to 1 times the Te content in the thermoelectric material layer 710. In addition, a Te content at a surface in which the first bonding layer 740 is in contact with the first plated layer 720, that is, an interface between the first plated layer 720 and the first bonding layer 740 or a Te content at a surface in which the second bonding layer 750 is in contact with the second plated layer 730, that is, an interface between the second plated layer 730 and the second bonding layer 750 may be in the range of 0.8 to 1 times the Te content at a surface in which the thermoelectric material layer 710 is in contact with the first bonding layer 740, that is, the interface between the thermoelectric material layer 710 and the first bonding layer 740, or a Te content at a surface in which the thermoelectric material layer 710 is in contact with the second bonding layer 750, that is, the interface between the thermoelectric material layer 710 and the second bonding layer 750. In addition, the Te content at the interface between the thermoelectric material layer 710 and the first bonding layer 740 or the Te content at the interface between the thermoelectric material layer 710 and the second bonding layer 750 may be in the range of 0.8 to 1 times the Te content at the centerline of the thermoelectric material layer 710.

Figure 10:
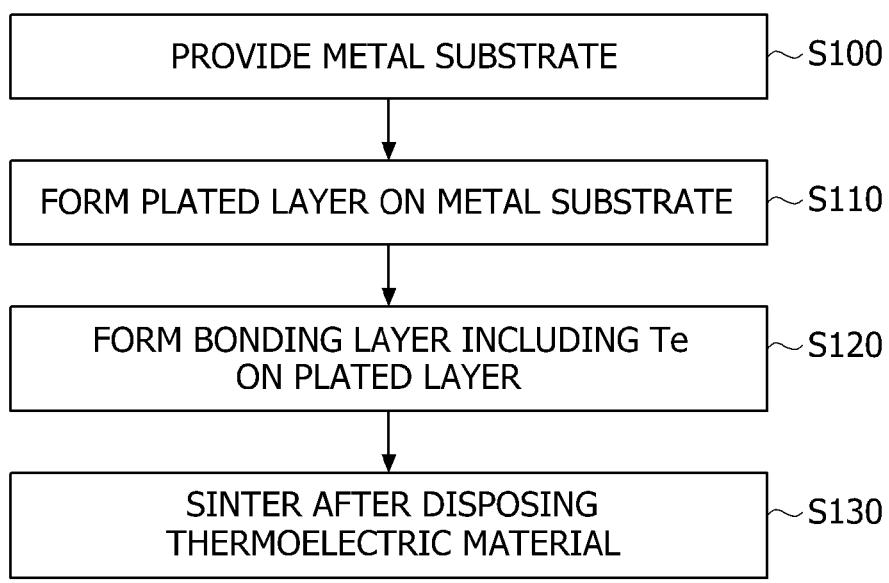
FIG. 10 is a flowchart illustrating a method of manufacturing a thermoelectric leg according to one embodiment of the present invention.

FIG. 10 is a flowchart illustrating a method of manufacturing a thermoelectric leg according to one embodiment of the present invention.

Referring to FIG. 10, a metal substrate is provided (S100). Here, the metal substrate may be each of the first metal layer 760 and the second metal layer 770 of the thermoelectric leg 700 of FIG. 7. That is, the metal substrate may include Cu, a Cu alloy, Al, or an Al alloy.

Next, a Ni plated layer is formed on one surface of the metal substrate (S110). Here, the plated layer may be formed of at least one metal among Sn, Ti, Fe, Sb, Cr, and Mo in addition to being formed of Ni. In addition, the plated layer may also be formed on both surfaces of the metal substrate. In the present specification, the plated layer refers to a layer including at least one metal among Ni, Sn, Ti, Fe, Sb, Cr, and Mo and formed through a plating process, but may refer to any layer deposited through various processes.

Next, a bonding layer including Te is formed on the plated layer (S120). To this end, the plated layer is coated with a slurry in which a Te powder is mixed with an alcohol and heat-treated at a temperature of 300 to 400° C. Accordingly, Te on the plated layer coated with Te may be diffused toward the plated layer and react with Ni to form the bonding layer. Here, Te reacts with Ni within a thickness, and the thickness becomes a thickness of the Ni—Te bonding layer. Here, the bonding layer may also be formed by reacting not only Ni, but also at least one metal among Sn, Ti, Fe, Sb, Cr, and Mo, with Te. The remaining unreacted Te powder on the bonding layer is removed by cleaning.

Alternatively, the bonding layer may also be formed by vacuum-depositing a Te source on the plated layer. That is, Te deposited on the plated layer also may diffuse toward the plated layer and react with Ni to form the bonding layer. Alternatively, the bonding layer may also be formed by vacuum-depositing a Ni—Te source on the plated layer. Alternatively, the Ni—Te vacuum-deposited layer may also be formed by directly applying a Ni—Te source on the metal substrate without performing operation S110 in which the plated layer is formed.

Alternatively, the bonding layer may also be formed with a desired thickness using a method in which Te ions are added in a plating solution after the plated layer is formed to have a predetermined thickness in operation S110.

Next, a thermoelectric material including Bi and Te is interposed between two metal substrates/plated layers/bonding layers formed through operations S100 to S120, pressed, and sintered (S130). Here, the metal substrates/plated layers/bonding layers formed through operations S100 to S120 may be cut with a predetermined size, disposed on both surfaces of the thermoelectric material, pressed, and sintered. Alternatively, after a metal substrate/plated layer/bonding layer is manufactured with a predetermined size through operations S100 to S120, operations S100 to S120 may be repeated to manufacture a metal substrate/plated layer/bonding layer with a predetermined size, which are disposed on both surfaces of the thermoelectric material, pressed, and sintered.

Here, the pressing and sintering may be performed in a hot press process. The hot press process may be a spark plasma sintering (SPS) process in which a pulse current is applied from a direct current (DC) source to generate Joule heating. Since the SPS process is performed through a process in which high energy promotes heat diffusion between particles due to an instantaneously generated spark phenomenon, superior sintering controllability can be obtained, that is, a sintering process of a fine structure in which particle growth is small is easily controlled. Here, the thermoelectric material may be sintered with an amorphous ribbon. When the powder for the thermoelectric leg is sintered with the amorphous ribbon, since electric conductivity increases, high thermoelectric performance can be obtained. Here, the amorphous ribbon may be a Fe-based amorphous ribbon. For example, the amorphous ribbon may be sintered after being disposed on a side surface of the thermoelectric leg. Accordingly, electric conductivity may increase along the side surface of the thermoelectric leg. To this end, the amorphous ribbon may be disposed to surround a wall surface of a mold, filled with the thermoelectric material, and sintered. Here, the amorphous ribbon may be disposed on a side surface of the thermoelectric material layer in the thermoelectric leg.

Figure 11:
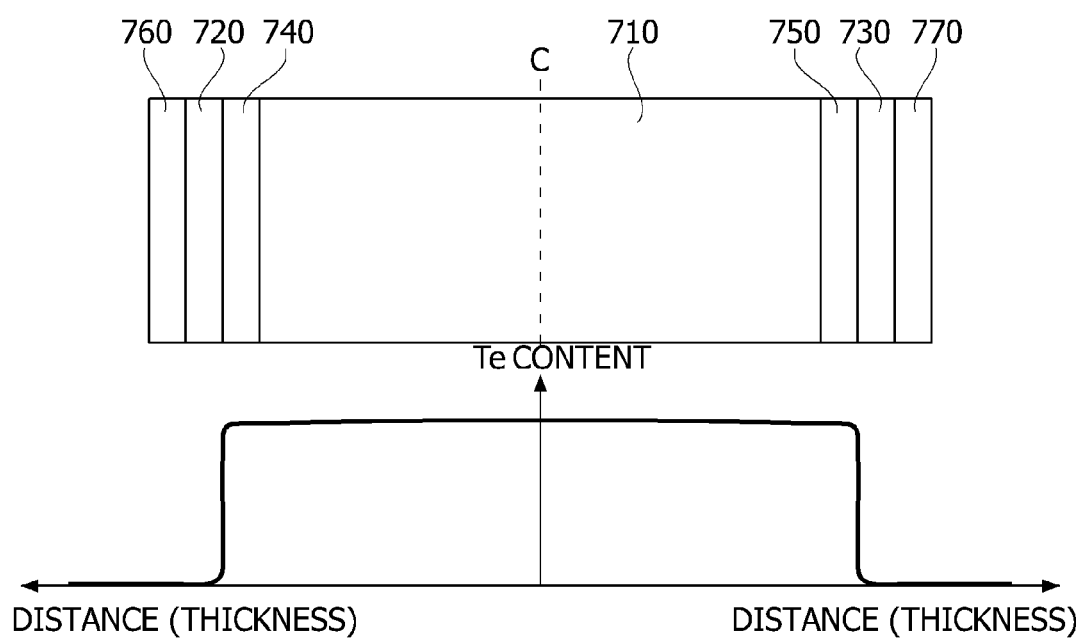
FIG. 11 is a schematic view illustrating a Te content distribution in the thermoelectric leg manufactured through the method of FIG. 10.
Figure 12:
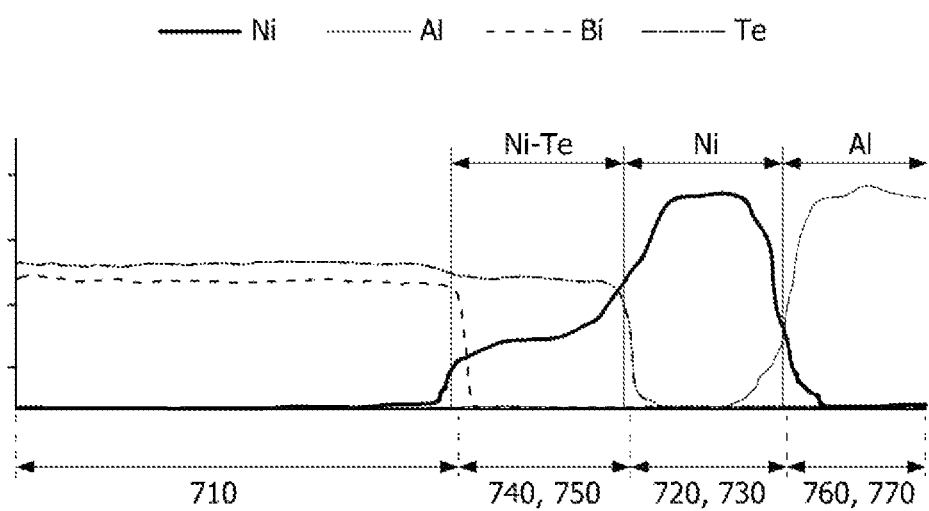
FIG. 12 is a graph showing analysis of a composition distribution for each region in the thermoelectric leg manufactured through the method of FIG. 10.
Figure 13:
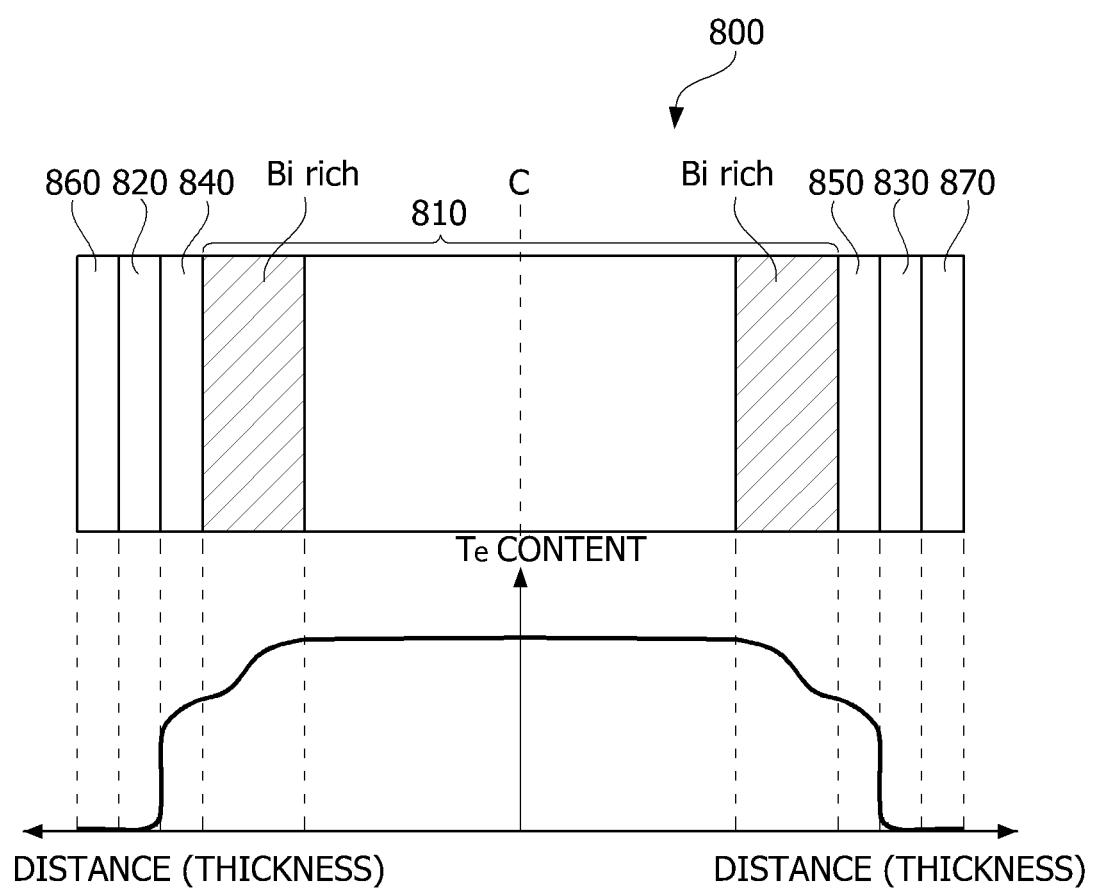
FIG. 13 is a schematic view illustrating a Te content distribution in a thermoelectric leg manufactured based on conditions of a Comparative example.
Figure 14:
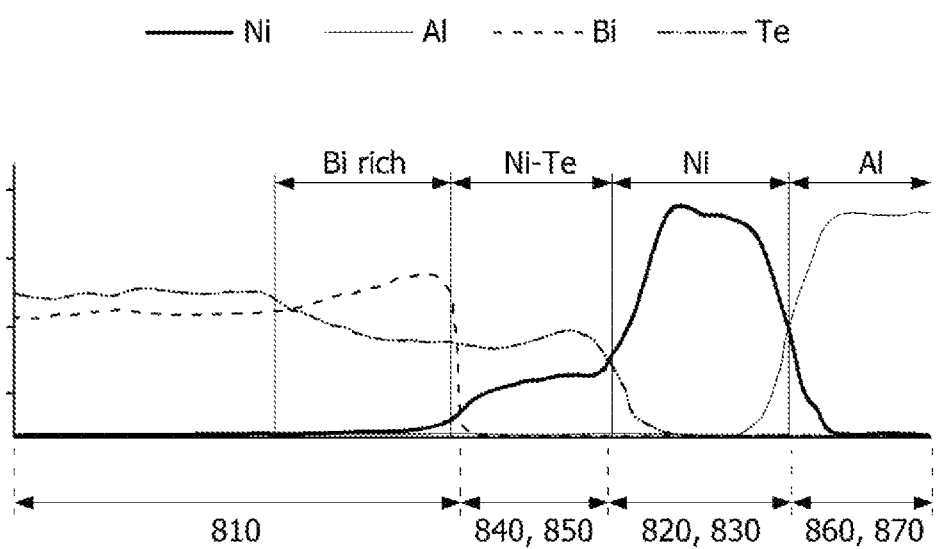
FIG. 14 is a graph showing analysis of a composition distribution for each region in the thermoelectric leg manufactured based on conditions of the comparative example.

FIG. 11 is a schematic view illustrating a Te content distribution in the thermoelectric leg manufactured through the method of FIG. 10, FIG. 12 is a graph showing analysis of a composition distribution for each region in the thermoelectric leg manufactured through the method of FIG. 10, FIG. 13 is a schematic view illustrating a Te content distribution in a thermoelectric leg manufactured based on conditions of a comparative example, and FIG. 14 is a graph showing analysis of a composition distribution for each region in the thermoelectric leg manufactured based on conditions of the comparative example.

Referring to FIGS. 11 and 12, according to the embodiment, the plated layers 720 and 730 are respectively formed on the Al substrates 760 and 770 having thicknesses of 0.2 to 0.3 mm, the plated layers 720 and 730 are coated with Te and heat-treated to respectively form the bonding layers 740 and 750, the thermoelectric material layer 710 including Bi and Te and having a thickness of 1.6 mm is interposed between the aluminum substrates/plated layers/bonding layers, pressed, and sintered. Through a process in which the plated layers are coated with Te and heat-treated, Te on the plated layers coated with Te diffuses toward and reacts with Ni on the surfaces of the plated layers so that the bonding layers including Ni—Te are formed. Here, the thicknesses of the plated layers are in the range of 1 to 10 μm, and thicknesses of the bonding layers are about 40 μm.

In addition, referring to FIGS. 13 and 14, in a comparative example, plated layers 820 and 830 are formed on Al substrates 860 and 870 having thicknesses of 0.2 to 0.3 mm, and a thermoelectric material including Bi and Te and having a thickness of about 1.6 mm is interposed between the two Al substrates/plated layers, pressed, and sintered. In a process of pressing and sintering process, Te in the thermoelectric material diffuses toward and reacts with Ni on surfaces of the plated layers so that bonding layers 840 and 850 including Ni—Te are formed. In addition, since Te diffuses toward the plated layers at an edge of the thermoelectric material, a Bi-rich layer in which Bi content has relatively increased is formed.

Referring to FIGS. 11 to 14, a Te content in the first plated layer 720 or 820 or the second plated layer 730 or 830 is less than the Te content in the thermoelectric material layer 710 or 810 and the first bonding layer 740 or 840 or the second bonding layer 750 or 850.

Here, according to FIGS. 11 and 12, it can be seen that the Te content at the centerline C of the thermoelectric material layer 710 is the same as or similar to the Te content at the interface between the thermoelectric material layer 710 and the first bonding layer 740 or the interface between thermoelectric material layer 710 and the second bonding layer 750. In the present specification, the centerline C may be the centerline C itself of the thermoelectric material layer 710, or a region including the centerline C and a region adjacent the centerline C within a predetermined distance from the centerline C. In addition, an interface may be the interface itself, or a region including the interface and a region adjacent the interface within a predetermined distance from the interface. For example, the Te content at the interface between the thermoelectric material layer 710 and the first bonding layer 740 or the interface between the thermoelectric material layer 710 and the second bonding layer 750 may be in the range of 0.8 to 1 times, preferably in the range of 0.85 to 1 times, more preferably in the range of 0.9 to 1 times, and even more preferably in the range of 0.95 to 1 times the Te content at the centerline C of the thermoelectric material layer 710. Here, the content may be a weight ratio.

In addition, a Bi content of the centerline C of the thermoelectric material layer 710 may be the same as or similar to a Bi content of the interface between the thermoelectric material layer 710 and the first bonding layer 740 or the interface between thermoelectric material layer 710 and the second bonding layer 750. Accordingly, since the Te content is greater than a Bi content from the centerline C of the thermoelectric material layer 710 to the interface between the thermoelectric material layer 710 and the first bonding layer 740 or the interface between thermoelectric material layer 710 and the second bonding layer 750, there are no regions in which the Bi content is greater than the Te content around the interface between the thermoelectric material layer 710 and the first bonding layer 740 and around the interface between thermoelectric material layer 710 and the second bonding layer 750. For example, the Bi content of the interface between the thermoelectric material layer 710 and the first bonding layer 740 or the interface between thermoelectric material layer 710 and the second bonding layer 750 may be in the range of 0.8 to 1 times, preferably in the range of 0.85 to 1 times, more preferably in the range of 0.9 to 1, even more preferably in the range of 0.95 to 1 times the Bi content of the centerline C of the thermoelectric material layer 710. Here, the content may be a weight ratio.

However, according to FIGS. 13 and 14, it can be seen that the Te content at a centerline C of a thermoelectric material layer 810 is greater than the Te content at an interface between the thermoelectric material layer 810 and a first bonding layer 840 or an interface between the thermoelectric material layer 810 and second bonding layer 850. This is because Te which is a semiconductor material in the thermoelectric material layer 810 naturally diffuses into a first plated layer 820 and a second plated layer 830 to react with the first plated layer 820 and the second plated layer 830. Accordingly, the Te content decreases from the centerline C of the thermoelectric material layer 810 toward an edge thereof, and Bi-rich layers are formed from regions in which Te diffuses to react with the first plated layer 820 and the second plated layer 830 to a boundary between the thermoelectric material layer 810 and the first plated layer 820 and to a boundary between the thermoelectric material layer 810 and the second plated layer 830. A thickness of the Bi-rich layer may be 200 μm or less. That is, although the Te content is greater than the Bi content around the centerline C of the thermoelectric material layer 810, there is a region in which the Bi content is greater than the Te content around the interface between the thermoelectric material layer 810 and the first bonding layer 840 or around the interface between thermoelectric material layer 810 and the second bonding layer 850. The Bi-rich layer is a region in which a proper stoichiometry ratio between Bi and Te which are basic materials of the thermoelectric material is broken, and may be formed around an interface between the thermoelectric material layer 810 and the bonding layer 840 and around an interface between the thermoelectric material layer 810 and the bonding layer 850. As the Bi-rich layer is thicker, a resistance change rate increases, and this may be an important factor for increasing the internal resistance of the thermoelectric leg.

In addition, according to FIGS. 11 and 12, the Te content in the first bonding layer 740 or second bonding layer 750 is the same as or similar to the Te content in the thermoelectric material layer 710. For example, the Te content in the first bonding layer 740 or second bonding layer 750 may be in the range of 0.8 to 1 times, preferably in the range of 0.85 to 1 times, more preferably in the range of 0.9 to 1 times, even more preferably in the range of 0.95 to 1 times the Te content in the thermoelectric material layer 710. Here, the content may be a weight ratio. For example, in a case in which the thermoelectric material layer 710 includes Te at 50 wt %, the first bonding layer 740 or second bonding layer 750 may include Te in the range of 40 to 50 wt %, preferably in the range of 42.5 to 50 wt %, more preferably in the range of 45 to 50 wt %, even more preferably in the range of 47.5 to 50 wt %. In addition, the Te content may be greater than a Ni content in the first bonding layer 740 or second bonding layer 750. Although the Te content is uniformly distributed in the first bonding layer 740 or second bonding layer 750, the Ni content may decrease in the first bonding layer 740 or second bonding layer 750 toward the thermoelectric material layer 710.

Meanwhile, a part of a material included in each of the layers may be diffused from an interface between adjacent layers and detected in the adjacent layers. For example, a part of a material included in a metal layer may be diffused from an interface between the metal layer and a plated layer and detected in the plated layer, a part of a material included in the plated layer may be diffused from an interface between the plated layer and a bonding layer and detected in the bonding layer, and a part of a material included in the bonding layer may be diffused from an interface between the bonding layer and a thermoelectric material layer and detected in the thermoelectric material layer. In addition, a part of the material included in the plated layer may be diffused from the interface between the metal layer and the plated layer and detected in the metal layer, a part of the material included in the bonding layer may be diffused from the interface between the plated layer and the bonding layer and detected in the plated layer, and a part of the material included in the thermoelectric material layer may be diffused from the interface between the bonding layer and the thermoelectric material layer and detected in the bonding layer.

However, according to FIGS. 13 and 14, the Te content in the first bonding layer 840 or second bonding layer 850 is less than the Te content in the thermoelectric material layer 810. This is because, since the first plated layer 720 or second plated layer 730 is coated with Te to form the first bonding layer 740 or second bonding layer 750, the Te content is uniformly maintained in FIGS. 11 and 12, but the Te in the thermoelectric material layer 810 is naturally diffused to react with the first plated layer 820 or second plated layer 830 in FIGS. 13 and 14.

In addition, according to FIGS. 11 and 12, the Te content at the interface between the first plated layer 720 and the first bonding layer 740 or the interface between the second plated layer 730 and the second bonding layer 750 is the same as or similar to the Te content at the interface between the thermoelectric material layer 710 and the first bonding layer 740 or the interface between thermoelectric material layer 710 and the second bonding layer 750. For example, the Te content at the interface between the first plated layer 720 and the first bonding layer 740 or the interface between the second plated layer 730 and the second bonding layer 750 may be in the range of 0.8 to 1 times, preferably in the range of 0.85 to 1 times, more preferably in the range of 0.9 to 1 times, even more preferably in the range of 0.95 to 1 times the Te content at the interface between the thermoelectric material layer 710 and the first bonding layer 740 or the interface between the thermoelectric material layer 710 and the second bonding layer 750. Here, the content may be a weight ratio.

However, according to FIGS. 13 and 14, the Te content at an interface between the first plated layer 820 and the first bonding layer 840 or an interface between the second plated layer 830 and the second bonding layer 850 is less than the Te content at an interface between the thermoelectric material layer 810 and the first bonding layer 840 or an interface between the thermoelectric material layer 810 and the second bonding layer 850. This is because, since the first plated layer 720 or second plated layer 730 is coated with Te to form the first bonding layer 740 or second bonding layer 750, the Te content is uniformly maintained in FIGS. 11 and 12, but Te in the thermoelectric material layer 810 naturally diffuses to react with the first plated layer 820 or second plated layer 830 in FIGS. 13 and 14.

Table 1 is a table in which electrical resistances of the P-type thermoelectric legs according to the embodiment and the comparative example are compared.

TABLE 1

| Classification | Size | Resistance |
| --- | --- | --- |
| Embodiment | 4 mm*4 mm*5 mm | $3.3*10^{-3}$ Ω |
| | 4 mm*4 mm*1.2 mm | $0.8*10^{-3}$ Ω |
| Comparative example | 4 mm*4 mm*5 mm | $4.5*10^{-3}$ Ω |
| | 4 mm*4 mm*1.2 mm | $2.05*10^{-3}$ Ω |

Referring to Table 1, an electrical resistance of the thermoelectric leg manufactured according to the embodiment illustrated in FIGS. 11 and 12 was less than that of the comparative example of the thermoelectric leg manufactured as illustrated in FIGS. 13 and 14. Particularly, in a case in which the thermoelectric leg is small, it can be seen that an electrical resistance decrease rate was increased. This is because the Te content in the thermoelectric leg is uniformly distributed and generation of the Bi-rich layer is suppressed. Here, since a decrease in resistance of the thermoelectric leg may prevent a decrease in electric conductivity of the thermoelectric element, the decrease in resistance of the thermoelectric leg may be an important factor for increasing a Seebeck index of the thermoelectric element.

Table 2 is a table in which tensile strengths of the thermoelectric legs each having a size of 4 mm*4 mm*5 mm according to the embodiment and the comparative example are compared.

TABLE 2

| Tensile strength | N-type (Kgf/mm²) | P-type (Kgf/mm²) |
|---|---|---|
| Comparative example | 0.65 | 2.45 |
| Embodiment | 1.65 | 2.55 |

Referring to Table 2, a tensile strength of the thermoelectric leg manufactured according to the embodiment illustrated in FIGS. 11 and 12 was greater than that of the comparative example of the thermoelectric leg manufactured as illustrated in FIGS. 13 and 14. The tensile strength is a bonding force between the layers in the thermoelectric leg, and represents a maximum load the first metal layer and the second metal layer can withstand when metal wires are bonded to the first metal layer and the second metal layer of both sides of the manufactured thermoelectric leg and the bonded metal wires are pulled in opposite directions. As the tensile strength increases, the bonding force between the layers in the thermoelectric leg increases, and thus a problem that at least a part of the metal layers, plated layers, bonding layers and thermoelectric material layers in the thermoelectric leg is separated from the adjacent layers when the thermoelectric element is driven may be prevented. The thermoelectric element according to the embodiment of the present invention may be applied to power generation apparatuses, cooling apparatuses, heating apparatuses, and the like. Specifically, the thermoelectric element according to the embodiment of the present invention may be mainly applied to optical communication modules, sensors, medical instruments, measuring instruments, aerospace industrial fields, refrigerators, chillers, automotive ventilation sheets, cup holders, washers, dryers, wine cellars, water purifiers, sensor power supplies, thermopiles, and the like.

Here, as an example of the thermoelectric element according to the embodiment of the present invention, which is applied to medical instruments, there are polymerase chain reaction (PCR) instruments. The PCR instrument is an apparatus in which deoxyribonucleic acid (DNA) is amplified to determine a sequence of DNA, precise temperature control is required, and a thermal cycle is required. To this end, a Peltier-based thermoelectric element can be applied thereto.

As another example of the thermoelectric element according to the embodiment of the present invention, which is applied to medical instruments, there are photodetectors. Here, the photodetectors include infrared/ultraviolet detectors, charge coupled device (CCD) sensors, X-ray detectors, and thermoelectric thermal reference sources (TTRS). The Peltier-based thermoelectric element may be applied for cooling the photodetector. Accordingly, a change in wavelength, and decreases in output power and resolution due to an increase in temperature in the photo detector can be prevented.

As still another example of the thermoelectric element according to the embodiment of the present invention, which is applied to medical instruments, there are an immunoassay field, an in vitro diagnostic field, temperature control and cooling systems, a physiotherapy field, liquid chiller systems, a blood/plasma temperature control field, and the like. Accordingly, a temperature can be precisely controlled.

As yet another example of the thermoelectric element according to the embodiment of the present invention, which is applied to medical instruments, there are artificial hearts. Accordingly, power can be supplied to the artificial heart.

As an example of the thermoelectric element according to the embodiment of the present invention, which is applied to aerospace industrial field, there are star tracking systems, thermal imaging cameras, infrared/ultraviolet detectors, CCD sensors, Hubble space telescopes, TTRS, and the like. Accordingly, a temperature of an image sensor can be maintained.

As another example of the thermoelectric element according to the embodiment of the present invention, which is applied to aerospace industrial field, there are cooling apparatuses, heaters, power generation apparatuses, and the like.

In addition, the thermoelectric element according to the embodiment of the present invention may be applied to the other industrial fields for power generation, cooling, and heating.

The above-described present invention is not limited to the above-described embodiments and the accompanying drawings, and it will be clear to those skilled in the art that various substitutions, modifications, and changes may be made without departing from the technical spirit of the embodiment.

The present invention is directed to providing a thermoelectric element with high thermoelectric performance and a thermoelectric leg included therein.

One aspect of the present invention provides a thermoelectric leg including a thermoelectric material layer including Bi and Te, a first metal layer and a second metal layer respectively disposed on one surface of the thermoelectric material layer and the other surface thereof, a first bonding layer interposed between the thermoelectric material layer and the first metal layer and including Te, a second bonding layer interposed between the thermoelectric material layer and the second metal layer and including Te, a first plated layer interposed between the first metal layer and the first bonding layer, and a second plated layer interposed between the second metal layer and the second bonding layer, wherein the thermoelectric material layer is interposed between the first metal layer and the second metal layer, a content of the Te is higher than a content of the Bi from a centerline of the thermoelectric material layer to an interface between the thermoelectric material layer and the first bonding layer, and a content of the Te is higher than a content of the Bi from the centerline of the thermoelectric material layer to an interface between the thermoelectric material layer and the second bonding layer.

A content of the Te at a predetermined position between the centerline of the thermoelectric material layer and the interface between the thermoelectric material layer and the first bonding layer may be in a range of 0.8 to 1 times a content of the Te at the centerline of the thermoelectric material layer.

A content of the Te in the first bonding layer may be in a range of 0.8 to 1 times a content of the Te in the thermoelectric material layer.

A content of the Te may be the same from the interface between the thermoelectric material layer and the first bonding layer to an interface between the first bonding layer and the first plated layer.

A content of the Te at a predetermined position which is within 100 μm from the interface between the thermoelectric material layer and the first bonding layer toward the centerline of the thermoelectric material layer may be in a range of 0.8 to 1 times the content of the Te at the centerline of the thermoelectric material layer.

At least one of the first plated layer and the second plated layer may include at least one metal among Ni, Sn, Ti, Fe, Sb, Cr, and Mo.

At least one of the first bonding layer and the second bonding layer further may include the at least one metal included in the first plated layer and the second plated layer.

At least one of the first metal layer and the second metal layer may include copper, a copper alloy, aluminum, or an aluminum alloy.

A content of the Te in at least one of the first bonding layer and the second bonding layer may be in a range of 0.9 to 1 times the content of the Te in the thermoelectric material layer.

The content of the Te in at least one of the first bonding layer and the second bonding layer may be in a range of 0.95 to 1 times the content of the Te in the thermoelectric material layer.

A thickness of the first plated layer may be in a range of 1 μm to 20 μm.

The thermoelectric material layer may be in direct contact with the first bonding layer, and the thermoelectric material layer may be in direct contact with the second bonding layer.

The first bonding layer may be in direct contact with the first plated layer, and the second bonding layer may be in direct contact with the second plated layer.

The first plated layer may be in direct contact with the first metal layer, and the second plated layer may be in direct contact with the second metal layer.

Another aspect of the present invention provides a thermoelectric element including a first substrate, a plurality of P-type thermoelectric legs and a plurality of N-type thermoelectric legs alternately disposed on the first substrate, a second substrate disposed on the plurality of P-type thermoelectric legs and the plurality of N-type thermoelectric legs, and a plurality of electrodes connecting the plurality of P-type thermoelectric legs and the plurality of N-type thermoelectric legs in series, wherein each of the plurality of P-type thermoelectric legs and the plurality of N-type thermoelectric legs includes a thermoelectric material layer including Bi and Te, a first metal layer and a second metal layer respectively disposed on one surface of the thermoelectric material layer and the other surface thereof, a first bonding layer interposed between the thermoelectric material layer and the first metal layer and including Te, a second bonding layer interposed between the thermoelectric material layer and the second metal layer and including Te, a first plated layer interposed between the first metal layer and the first bonding layer, and a second plated layer interposed between the second metal layer and the second bonding layer, the thermoelectric material layer is interposed between the first metal layer and the second metal layer, a content of the Te is higher than a content of the Bi from a centerline of the thermoelectric material layer to an interface between the thermoelectric material layer and the first bonding layer, and a content of the Te is higher than a content of the Bi from the centerline of the thermoelectric material layer to an interface between the thermoelectric material layer and the second bonding layer.

Still another aspect of the present invention provides a method of manufacturing a thermoelectric leg including preparing a first metal substrate, forming a first plated layer on the first metal substrate, forming a first bonding layer including Te on the first plated layer, disposing a thermoelectric material layer including Bi and Te on an upper surface of the first bonding layer, disposing a second metal substrate, on which a second bonding layer and a second plated layer are formed, on the thermoelectric material layer, and sintering the first metal substrate, the first plated layer, the first bonding layer, the thermoelectric material layer, the second metal substrate, the second bonding layer, and the second plated layer.

The forming of the first bonding layer may include coating the first plated layer with slurry including Te and heat-treating the first plated layer coated with the slurry.

The forming of the first bonding layer may include introducing and vacuum-depositing a source including Te and a material of the first plated layer on the first plated layer.

The forming of the first bonding layer may include adding Te ions in a plating solution for forming the first plated layer.

The thermoelectric material layer may be interposed between the first bonding layer and the second bonding layer, and the first bonding layer may be opposite the second bonding layer.

The sintering may further include pressing the first metal substrate, the first plated layer, the first bonding layer, the thermoelectric material layer, the second metal substrate, the second bonding layer, and the second plated layer.

The metal substrate may be formed of a material selected from among copper, a copper alloy, aluminum, and an aluminum alloy.

The first plated layer may include at least one among Ni, Sn, Ti, Fe, Sb, Cr, and Mo.

The first bonding layer may further include at least one among Ni, Sn, Ti, Fe, Sb, Cr, and Mo.

The sintering may include a discharge plasma sintering method.

The heat-treating may include diffusing and reacting Te from a surface layer of the first plated layer.

According to the embodiments of the present invention, a thermoelectric element which has high thermoelectric performance and is thin and small can be obtained. Particularly, a thermoelectric leg, which is stably bonded to an electrode and in which a semiconductor material is uniformly distributed so that thermoelectric performance thereof is stable, can be obtained.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a thermoelectric leg comprising:
   preparing a first metal substrate including a first metal,
   forming a first plated layer including a second metal on the first metal substrate,
   disposing a layer including tellurium (Te) on the first plated layer,
   forming a portion of the first plated layer as a first bonding layer by reacting the second metal and the Te,
   disposing a thermoelectric material layer including bismuth (Bi) and Te on an upper surface of the first bonding layer,
   disposing a second metal substrate, on which a second bonding layer and a second plated layer are formed, on the thermoelectric material layer, and sintering,
   wherein:
      a weight content of Te is higher than a weight content of Bi, from a center of the thermoelectric material layer to an interface between the thermoelectric material layer and the first bonding layer,
      a weight content of Te is higher than a weight content of Bi, from the center of the thermoelectric material layer to an interface between the thermoelectric material layer and the second bonding layer,
      the interface between the thermoelectric material layer and the first bonding layer is included in a region in which Te and Bi decrease simultaneously in a direction of the first bonding layer, and
      the interface between the thermoelectric material layer and the second bonding layer is included in a region in which Te and Bi decrease simultaneously in a direction of the second bonding layer.

2. The method of claim 1, wherein:
   the disposing the layer including Te on the first plated layer includes applying slurry including Te on the first plated layer,
   the forming the portion of the first plated layer as the first bonding layer includes heat-treating.

3. The method of claim 2, wherein:
   the heat-treating includes applying heat so that Te diffuses from a surface layer of the first plated layer and reacts with the second metal.

4. The method of claim 1, wherein:
   the disposing the layer including Te on the first plated layer includes introducing and vacuum-depositing a source including Te and the second metal on the first plated layer.

5. The method of claim 1, wherein:
   the disposing the layer including Te on the first plated layer includes adding Te ions in a plating solution including the second metal.

6. The method of claim 1, wherein:
   the thermoelectric material layer is disposed between the first bonding layer and the second bonding layer, and the first bonding layer and the second bonding layer face each other.

7. The method of claim 1, wherein:
   the sintering including pressing.

8. The method of claim 1, wherein:
   at least one of the first metal substrate and the second metal substrate includes a material selected from copper, a copper alloy, aluminum and an aluminum alloy.

9. The method of claim 8, wherein:
   the first plated layer and the second plated layer include at least one of Ni, Sn, Ti, Fe, Sb, Cr and Mo.

10. The method of claim 1, wherein:
    the first plated layer and the second plated layer include Ni.

11. The method of claim 1, wherein:
    a discharge plasma sintering method is used on the sintering.

12. The method of claim 1, wherein:
    a weight content of Bi at the interface between the thermoelectric material layer and the first bonding layer is 0.8 to 1 times a weight content of Bi at the center of the thermoelectric material layer; and
    a weight content of Bi at the interface between the thermoelectric material layer and the second bonding layer is 0.8 to 1 times the weight content of Bi at the center of the thermoelectric material layer, and
    a region having the highest Bi weight content within the thermoelectric material layer, the first bonding layer, and the second bonding layer is disposed in the thermoelectric material layer.

13. The method of claim 1, wherein:
    a weight content of Bi at the interface between the thermoelectric material layer and the first bonding layer is 0.9 to 1 times a weight content of Bi at the center of the thermoelectric material layer; and
    a weight content of Bi at the interface between the thermoelectric material layer and the second bonding layer is 0.9 to 1 times the weight content of Bi at the center of the thermoelectric material layer, and
    a region having the highest Bi weight content within the thermoelectric material layer, the first bonding layer, and the second bonding layer is disposed in the thermoelectric material layer.

14. The method of claim 1, wherein:
    the thermoelectric material layer further includes at least one of Sb, Ni, Al, Cu, Ag, Pb, B, Ga, Te, Bi, and In.

15. The method of claim 1, wherein:
    at least one of the first metal substrate and the second metal substrate includes aluminum,
    at least one of the first plated layer and the second plated layer includes Ni.

16. The method of claim 1, wherein:
    the thermoelectric material layer is in direct contact with the first bonding layer;
    the thermoelectric material layer is in direct contact with the second bonding layer;
    the first bonding layer is in direct contact with the first plated layer; and
    the second bonding layer is in direct contact with the second plated layer.

17. A method of manufacturing a thermoelectric leg comprising:
    preparing a first metal substrate including a first metal,
    forming a first plated layer including a second metal on the first metal substrate,
    disposing a layer including tellurium (Te) on the first plated layer,
    forming a portion of the first plated layer as a first bonding layer by reacting the second metal and the Te,
    disposing a thermoelectric material layer including bismuth (Bi) and Te on an upper surface of the first bonding layer,
    disposing a second metal substrate, on which a second bonding layer and a second plated layer are formed, on the thermoelectric material layer, and sintering,
    wherein:
       a weight content of Te at an interface between the first bonding layer and the first plated layer is 0.8 to 1 times a weight content of Te at an interface between the thermoelectric material layer and the first bonding layer;

a weight content of Te at an interface between the second bonding layer and the second plated layer is 0.8 to 1 times a weight content of Te at the interface between the thermoelectric material layer and the second bonding layer, the interface between the first bonding layer and the first plated layer is included in a region in which a region where Te decreases in a direction of the first plated layer and a region where the second metal decreases in a direction of the thermoelectric material layer are overlapped, and the interface between the second bonding layer and the second plated layer is included in a region in which a region where Te decreases in a direction of the second plated layer and a region where the second metal decreases in a direction of the thermoelectric material layer are overlapped.

18. The method of claim 17, wherein:
a weight content of Te in a predetermined region from the interface between the thermoelectric material layer and the first bonding layer to the interface between the first bonding layer and the first plated layer is in a range of 0.8 to 1 times a weight content of Te at the interface between the thermoelectric material layer and the first bonding layer.

19. The method of claim 17, wherein:
the first plated layer and the second plated layer include at least one of Ni, Sn, Ti, Fe, Sb, Cr and Mo,
the interface between the first bonding layer and the first plated layer is a region in which a weight content of at least one metal included in the first plated layer is greater than a weight content of Te; and
the interface between the second bonding layer and the second plated layer is a region in which a weight content of at least one metal included in the second plated layer is greater than a weight content of Te.

* * * * *